United States Patent
Shi (10) Patent No.: US 6,198,089 B1
(45) Date of Patent: Mar. 6, 2001

(54) STEERABLE AND SCALABLE SPATIAL FILTERS

(75) Inventor: Bertram Emil Shi, Kowloon (HK)

(73) Assignee: The Hong Kong University of Science and Technology (HK)

( * ) Notice: Subject to any disclaimer, the term of this patent is extended or adjusted under 35 U.S.C. 154(b) by 0 days.

(21) Appl. No.: 09/281,919

(22) Filed: Mar. 31, 1999

(51) Int. Cl.$^7$ .................................................... H01J 40/14
(52) U.S. Cl. ..................................... 250/208.2; 250/214 R
(58) Field of Search .............................. 250/208.1, 208.2, 250/214 R, 214.1; 327/514

(56) References Cited

U.S. PATENT DOCUMENTS

| | | | |
|---|---|---|---|
| 5,086,219 | * | 2/1992 | Koch et al. ........................ 250/208.2 |
| 5,521,857 | * | 5/1996 | Ni et al. ................................ 364/820 |

OTHER PUBLICATIONS

Barbara, M. et al, "Synthesis of a Recurrent Double–Layer Transistor Network for Early–Vision Tasks", DIEE–Dept. of Electrical and Electronic Engineering University of Cagliari, Mar. 1998, 4 pps.

Bisio, G.M. et al, "An Analog VLSI Computational Engine for Early Vision Tasks", Proc. 7th International Conference on Neural Networks, ICANN '97, Lansanne, Switzerland, 1997, pp. 1175–1180.

Freeman, W.T. et al, "Teh Design and Use of Steerable Filters", IEEE Transactions on Pattern Analysis and Machine Intelligence, vol. 13, No. 9, Sep. 1991, pp. 891–906.

Raffo, L., "Resistive Network Implementing Maps of Gabor Functions of Any Phase", Electronics Letters, Oct. 26, 1995, vol. 31, No. 22, pp. 1913–1914.

Raffo, L. et al, "Anisotropic Active Resistor Meshes for Implementing Image Processing Operators", Electronic Letters, May 27, 1993, vol. 29, No. 11, pp. 960–961.

Shi, B.E., "Gabor–Type Image Filtering With Cellular Neural Networks", Proceedings of the 1996 IEEE International Symposium of Circuits and Systems, Atlanta, GA., May 1996, vol. 3, pp. 558–561.

* cited by examiner

*Primary Examiner*—Stephone B. Allen
(74) *Attorney, Agent, or Firm*—Burns, Doane, Swecker & Mathis, L.L.P.

(57) ABSTRACT

A circuit architecture for computing the outputs of odd and even symmetric spatial filters simultaneously comprises at least two resistive networks interconnected by at least one controlled current source. In one embodiment the nodes of the resistive network are arranged in a two-dimensional array to allow filtering of two-dimensional signals such as images. The resulting filters are orientation selective. The spatial orientation and the scale of the filter can be selected by appropriately tuning the resistive elements forming the resistive networks and the gains of the controlled sources. The controlled sources may be voltage controlled (eg transconductance amplifiers) or current controlled. This circuit architecture may be implemented in VLSI to incorporate both image sensing and orientation selective filtering on the same chip. The high computational speed of the resulting devices, as well as the ability to adjust the spatial orientation and scale of the filters, enables the computation in real time of the outputs of several filters tuned to a variety of orientations and scales.

26 Claims, 5 Drawing Sheets

STEERABLE AND SCALABLE SPATIAL FILTERS

FIELD OF THE INVENTION

This invention relates to the circuit architecture of two-dimensional steerable and scalable spatial filters for image processing apparatus, and in particular to such filters adapted to spatially filter a set of input currents supplied by an array of photosensitive inputs forming an image sensor.

BACKGROUND OF THE INVENTION

Oriented filters are useful for vision and image processing tasks such as texture analysis, edge detection, and motion analysis. An important sub-class of oriented filters are Gabor filters, which have complex valued convolution kernel $$g(x, y) = \frac{1}{\sqrt{2\pi}\,\sigma} e^{-\frac{x^2+y^2}{2\sigma^2}} e^{j(\omega_{xo} x + \omega_{yo} y)}$$

where $\sigma$, $\omega_{xo}$, $\omega_{yo}$. This filter is tuned to spatial frequency ($\omega_{x0}$, $\omega_{y0}$) and responds maximally to edges which are oriented at an angle $\theta = \mathrm{atan}(\omega_{yo}/\omega_{xo})$ where $\theta$ is defined to be the angle between the horizontal (x) axis and the line perpendicular to the edge. The real part of g(x,y) is often referred to as the even Gabor filter kernel since it is even symmetric. The imaginary part of g(x,y) is often referred to as the odd Gabor filter kernel since it is odd symmetric. Gabor filter kernels have been used to model the receptive fields of neurons in the visual cortex. They have also found applications in computer vision such as stereo vision, binocular vergence control, texture segmentation and face recognition.

One problem with using oriented filters is that it is often necessary to compute the outputs of many filters tuned to different orientations which can be computationally expensive. To overcome this difficulty when using serial digital processing, Freeman and Adelson proposed the use of "steerable filters" (W. T. Freeman & E. H. Adelson, "*The design and use of steerable filters*" *IEEE Trans. Pattern Analysis and Machine Intelligence*, vol. 13, no. 9, pp 891–906, Sept. 1991) wherein the output of a filter tuned to an arbitrary orientation can be synthesized as a linear combination of the outputs of a small set of "basis filters". Steerable filters are especially useful for applications where the filter orientation must be adaptively tuned to match the image characteristics. Unfortunately, Gabor filters are not steerable in this sense.

Another important concept in the field of image processing is that of "scale space" (A. P. Witkin "*Scale-space filtering*" *Proc. 8th Int. Joint Conf. Artificial Intelligence*, pp. 1019–1022 IEEE 1983). The concept of scale space is that images consist of details at multiple "scales" or sizes. This may be best understood by reference to an example such as an image of a tree. At the largest scale, the boundary between the tree and the background may be detected, whereas at the smallest scale the boundaries between different leaves may be detected. Scale space filtering refers to the filtering of an image with convolution kernels of different sizes.

PRIOR ART

Several analog circuit architectures and hardware realizations for convolving one dimensional images with Gabor-type filters have been reported. A resistor network with negative resistive connections between second nearest elements was shown to be able to implement an even Gabor-type filter (L. Raffo, S. P. Sabatini, D. D. Caviglia and G. M. Bisio, "*Anisotropic active resistor meshes for implementing image processing operators*" *Electronics Letters*, vol. 29, no. 22, pp. 960–961 May 27, 1993). Gabor-type filters with arbitrary phase can be obtained by linear combinations of the outputs of three nearest neighbour cells (L. Raffo "*Resistive network implementing maps of Gabor functions of any phase*", *Electronics Letters*, vol. 31, no. 22, pp 1913–1914, Oct. 26, 1995), and an implementation of a one dimensional array of nine cells based on transconductance amplifiers is also known (G. M. Bisio, G. M. Bo, M. Confalone, L. Raffo, S. P. Sabatini and M. P. Zizola "*An analog VLSI computational engine for early vision tasks*" *Proc. 7th Intl. Conf. Artificial Neural Networks—ICANN '97*, pp. 1175–80, 1997). Also known are simulations of a double-layer transistor network operating in sub-threshold which overcomes the problem of negative resistance connections between second nearest neighbours (M. Barbaro, A. Nazarro, L. Raffo, "*Synthesis of a recurrent double-layer transistor network for early vision tasks*" *Proc. IEEE International Symposium on Circuits and Systems*, vol. 3, pp. 219–222, May 1998).

The present applicant has previously reported a one dimensional circuit architecture which simultaneously computes both odd and even Gabor-type filter outputs (B. Shi "*Gabor-type image filtering with cellular neural networks*" *Proc. IEEE International Symposium on Circuits and Systems*, vol. 3, pp. 558–561, May 1996). This previous architecture had a number of disadvantages, however. The first disadvantage is that for spatial frequencies less than 2atan0.5, not all filter bandwidths are achievable using only positive resistors. A second disadvantage was that the conductances of the resistors interconnecting the two resistive grids needed to matched with the gains of the transconductance amplifiers. A final disadvantage was that allowing only positive resistance values, the network could only be tuned to positive spatial frequencies. One of the major disadvantages of all of these one dimensional architectures is that it is not clear how they can be extended to two dimensional filtering where the scale and orientation of the Gabor-type filter can be tuned electronically.

SUMMARY OF THE INVENTION

An object of the present invention is to provide an analog circuit architecture which is able to compute the outputs of oriented filters with tunable orientation and scale. The filters are Gabor-type filter, which are similar to Gabor filters except that the functions modulating the complex exponentials are not Gaussian.

According to the present invention therefore there is provided an analog circuit for spatially filtering a plurality of signals simultaneously at inputs to an array comprising:

(a) a first resistive network having a plurality of nodes, each said node being associated with an input to the array, (b) a second resistive network having a plurality of nodes, each said node being associated with an input to the array, (c) means for injecting a current into each node of the first resistive network such that the magnitude of said current is dependent upon the voltages and/or currents in the second resistive network associated with nodes corresponding to the nearest neighbours of the corresponding input in the array, (d) means for injecting a current into each node of the second resistive network such that the magnitude of said current is dependent upon the voltages and/or currents in the first resistive network associated with nodes corresponding to the nearest neighbours of the corresponding input in the array, and (e) means for providing input to the circuit by injecting a current into each node of the said array such that the magnitude of said current is dependent upon the signal at the input of the array associated with said node.

The nodes are preferably disposed in a two-dimensional array, which is preferably a regular grid such as a rectangular, hexagonal or tridiagonal grid. However, although the invention is particularly useful in the context of a two-dimensional array, it may also be applied to a one-dimensional array which would still have a number of applications such as image tracking and alignment.

In preferred embodiments of the invention the means for injecting current dependent on the signal at each input to the array is a photosensitive element adapted to convert the intensity of light into an electrical current.

Preferably each of the resistive networks comprises transistor circuits such that the resistive connection between any first node and any second node of the circuit comprises a transistor circuit such that the current flowing between the first and second node increases monotonically with the voltage difference between the two nodes and the dependence between current and voltage is adjustable via one or more bias voltages.

In one possible embodiment the means for injecting current into each node of the first resistive network is a set of voltage controlled current sources controlled by the voltages at nodes in the second resistive network corresponding to nearest neighbours of the node in the array, and the means for injecting current into each node of the second resistive network is a set of voltage controlled current sources controlled by the voltages at nodes in the first resistive network corresponding to the nearest neighbours of the node in the array, and the dependence of the output currents on the control voltages is adjustable via one or more bias voltages.

In this embodiment the voltage controlled current sources may, for example, be transconductance amplifiers.

Preferably in this embodiment of the invention the nodes are disposed in a rectangular two-dimensional array and the current injected into each node of the first resistive network is supplied by two voltage controlled current sources, the first voltage controlled current source being controlled by the difference between the voltages at the nodes of the second resistive network corresponding to the right and left nearest neighbours of the node and the second voltage controlled current source being controlled by the difference between the voltages at the nodes of the second resistive network corresponding to the top and bottom nearest neighbours of the node, and the current injected into each node of the second resistive network being supplied by two voltage controlled current sources, the first voltage controlled current source being controlled by the difference between the voltages at the nodes of the first resistive network corresponding to the left and right nearest neighbours of the node and the second voltage controlled current source being controlled by the difference between the voltages at the nodes of the first resistive network corresponding to the bottom and the top nearest neighbours of the node.

In another embodiment of the invention the means for injecting current into each node of the first resistive network is a set of current controlled current sources whose inputs are the currents through resistive elements in the second resistive network connected to nodes corresponding to the nearest neighbours of the node in the array and wherein the means for injecting current into each node of the second resistive network is a set of current controlled current sources whose inputs are the currents through resistive elements connected to nodes in the first resistive network corresponding to the nearest neighbours of the node in the array, and wherein the dependence of the output currents on the control currents is adjustable via one or more bias voltages.

Whether or not the invention uses voltage or current controlled current sources, the resistive connections and the dependence of the injected currents on the voltages and/or currents may be adjusted to tune the orientation and scale of the filter.

It will be understood that the invention also extends to a device for spatially filtering a plurality of signals simultaneously at inputs to an array comprising a circuit as described above.

Furthermore, it will also be appreciated that the present invention extends to a method for filtering a two dimensional discrete signal with two filters simultaneously where the convolution kernel of the first said filter is even symmetric and orientation selective and wherein the convolution kernel of the second said filter is odd symmetric and orientation selective, comprising:

(a) providing first and second resistive networks, each said network having a plurality of nodes, each node being associated with one element of said two dimensional signal, (b) providing means for injecting current into each node of the first resistive network such that the magnitude of the current is dependent on the voltages and/or currents in the second resistive network associated with the nodes corresponding to the nearest neighbours of the corresponding element of the two-dimensional signal, (c) providing means for injecting current into each node of the second resistive network such that the magnitude of the current is dependent on the voltages and/or currents in the first resistive network associated with the nodes corresponding to the nearest neighbours of the corresponding element of the two-dimensional signal, (d) providing means for communicating the two-dimensional signal to the circuit by injecting a current into each node of the said array such that the magnitude of the said current is dependent upon the element of the two-dimensional signal associated with said node, and (e) providing means for outputting an electronic signal which depends upon a current or voltage associated with each node of the first and the second resistive networks.

BRIEF DESCRIPTION OF THE DRAWINGS

An embodiment of the invention will now be described by way of example and with reference to the accompanying drawings, in which:

FIG. 2 is a schematic illustration of the circuit architecture of a two dimensional filter, FIGS. 3(a) and (b) are measured (a) even and (b) odd filter outputs from a sensor tuned to horizontal orientations in response to a central light spot, FIGS. 4(a) and (b) are measured (a) even and (b) odd filter outputs from a sensor tuned to vertical orientations in response to a central light spot, FIGS. 5(a) and (b) are measured (a) even and (b) odd filter outputs from a sensor tuned to vertical orientations and a smaller scale than FIGS. 4(a) and (b) in response to a central light spot, FIGS. 6(a) and (b) are measured (a) even and (b) odd filter outputs from a sensor tuned to 45° orientations in response to a central light spot.

DETAILED DESCRIPTION OF PREFERRED EMBODIMENTS

Figure 1:
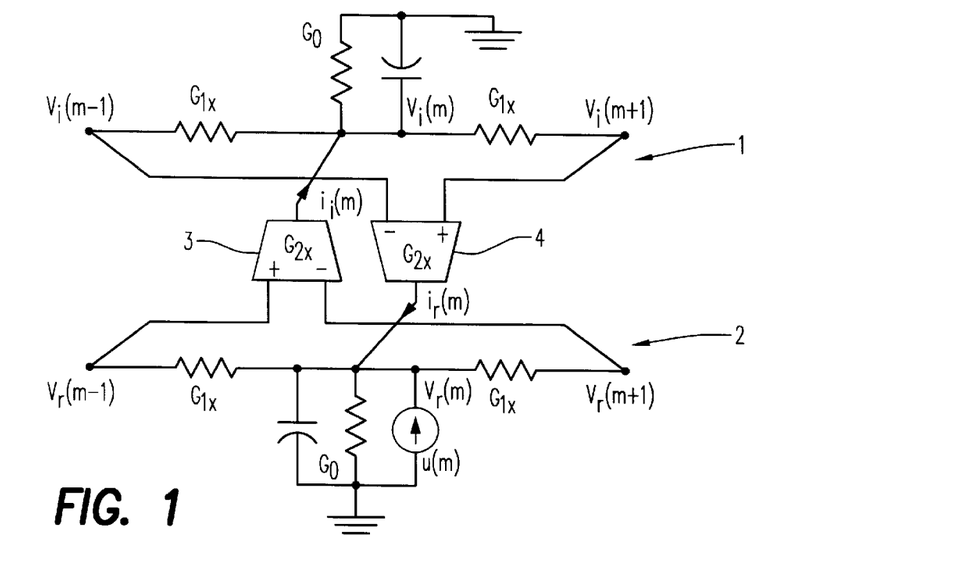
FIG. 1 is a schematic illustration of the circuit architecture of a one dimensional filter.

For ease of understanding and clarity, the present invention will firstly be described by reference to an embodiment in the form of a one dimensional array as shown in FIG. 1. Its description clarifies understanding to the two dimensional array described further below. The circuit of the embodiment of FIG. 1 comprises the architecture for one pixel in a one dimensional array and consists of two resistive arrays 1,2 which are coupled by a pair of transconductance amplifiers 3,4. The pixel of FIG. 1 may be designated as pixel m and connects to adjacent pixels m−1 and m+1 in an array of M pixels. In FIG. 1 the resistive elements are labeled by their conductances and the transconductance amplifiers are labeled by their gains.

In the array each pixel receives an input u(m) in the form of an input current encoding image intensity. The input current is supplied by any suitable photosensitive element. As will be shown by the following analysis, in this one dimensional embodiment the steady state voltages $v_r(m)$ and $v_i(m)$ at the corresponding nodes of the resistive arrays are even and odd Gabor-type filter outputs.

Defining $v(m)=v_r(m)+jv_i(m)$ to be the complex valued filter output at pixel m, writing Kirchoff's Current Law one can verify that $$\frac{d}{dt} v(m) = a_{-1}v(m-1) + a_0 v(m) + a_1 v(m+1) + u(m)$$

where $$\begin{bmatrix} a_{-1} \\ a_0 \\ a_1 \end{bmatrix} = \begin{bmatrix} G_{1x} + jG_{2x} \\ -G_0 - 2G_{1x} \\ G_{1x} - jG_{2x} \end{bmatrix}$$

Using the results of B. E. Shi, "*Gabor-type filtering in space and time with cellular neural networks*" IEEE Transactions on Circuits and Systems-I: Fundamental Theory and Applications, vol. 45, no. 2, pp. 121–132, Feb 1998 and assuming an infinite array the transfer function of the array is found to be $$\frac{V(\omega_x)}{U(\omega_x)} = H(\omega_x) = \frac{1}{\lambda^2 + \alpha^2(2 - 2\cos(\omega_x - \omega_{xo}))}$$

where $V(\omega_x)(U(\omega_x))$ represent the discrete Fourier transform of the output (input) and $$\alpha^2 = \sqrt{G_{1x}^2 + G_{2x}^2}$$
$$\lambda^2 = G_0 + 2G_{1x} - 2\alpha_x^2$$
$$\omega_{xo} = \mathrm{atan}(G_{2x}/G_{1x})$$

For small values of λ and $\omega_x$ close to $\omega_{xo}$, $H(\omega_x)$ is approximately equal to the continuous space filter transfer function, $$H_c(\omega_x) = \frac{1}{\lambda^2 + \alpha^2(\omega_x - \omega_{xo})^2}.$$

Thus the impulse response of the array is a discrete approximation to the continuous space impulse response $$h_c(x) = \frac{1}{2\alpha\lambda} e^{-\frac{\lambda}{\alpha}|x|} e^{j\omega_{xo} x}$$

which is similar to that of a one dimensional Gabor filter except that the Gaussian modulating function has been replaced by a Lapiacian modulating function.

In the above analysis the node voltages $v_r(m)$ and $v_i(m)$ are taken as the output of the array. However, as an alternative the currents $i_r(m)$ and $i_i(m)$ from the two transconductance amplifiers 3,4 may be taken as the output of the filter array. There are two advantages of doing so. The first is that the output may then be readily available simply by mirroring the output of the two transconductance amplifiers 3,4. The second advantage is that the computation of these currents involves an extra high pass filtering operation which removes constant and slowly varying components of the signal.

Defining the complex valued current output of the pixel to be $i(m)=i_r(m)+ji_i(m)$ this is related to the nodal voltage output by $$i(m)=jG_{2x}(v(m-1)-v(m+1))$$

Noting that $G_{2x}=\alpha^2 \sin\omega_{xo}$ it can be found that the transfer function from the input current to the output current is $$\frac{I(\omega_x)}{U(\omega_x)} = \frac{2\alpha^2 \sin\omega_{xo} \sin\omega_x}{\lambda^2 + \alpha^2(2 - 2\cos(\omega_x - \omega_{xo}))}$$

The differencing operation applied by the transconductance amplifiers is a discrete space approximation to differentiation. Since the filtering is linear, the operation of the array may be considered as filtering a high-pass filtered version of the input via the impulse response $h_c(x)$.

Figure 2:
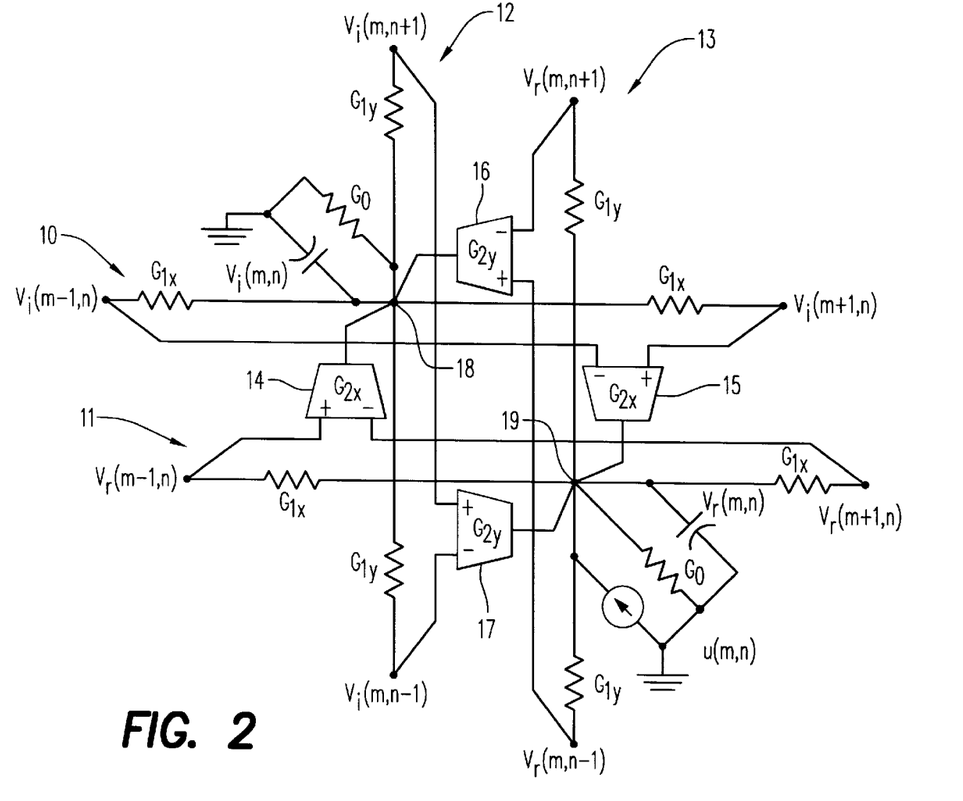

FIG. 2 illustrates the circuit architecture for one pixel (m,n) of a two dimensional array of M×N elements. Starting from the top of FIG. 2 and going clockwise around the figure, pixel (m,n) is connected to adjacent pixels (m, n+1), (m+1, n), (m, n−1), and (m−1, n). each pixel receives an input current u(m,n) from a photosensitive element of any desired type. It will be seen that the architecture comprises first and second resistive arrays 10,11 extending in the M direction of the array, ie towards pixels (m−1, n) and (m+1, n), and third and fourth resistive arrays, 12,13 extending in the N direction of the array. Transconductance amplifiers 14,15 connect arrays 10,11 and transconductance amplifiers 16,17 connect arrays 12,13. There are two common nodes 18,19. Node 18 is the junction of arrays 10 and 12 and the outputs of transconductance amplifiers 14 and 16 connect to this node. Node 19 is the junction of arrays 11 and 13 and the outputs of transconductance amplifiers 15 and 17 connect to this node. In FIG. 2 resistive elements are labeled by their conductances and the transconductance amplifiers are labeled by their gains.

The architecture of the embodiment of FIG. 2 implements the differential equation $$\frac{d}{dt}v(m,n) = \sum_{k,l=-r}^{t} a_{k,l}v(m+k, n+l) + bu(m,n)$$

Where $$\begin{bmatrix} a_{-1,1} & a_{0,1} & a_{-1,1} \\ a_{-1,0} & a_{0,0} & a_{1,0} \\ a_{-1,-1} & a_{0,-1} & a_{1,-1} \end{bmatrix} = \begin{bmatrix} 0 & G_{1y} - jG_{2y} & 0 \\ G_{1x} + jG_{2x} & -(2G_{1x} + 2G_{1y} + G_0) & G_{1x} - jG_{2x} \\ 0 & G_{1y} + jG_{2y} & 0 \end{bmatrix}$$

The transfer function from input current to nodal voltage is given by $$H(\omega_x, \omega_y) = \frac{1}{\lambda^2 + \alpha_x^2(2 - 2\cos(\omega_x - \omega_{xo})) + \alpha_y^2(2 - 2\cos(\omega_y - \omega_{yo}))}$$

Where $$\alpha_x^2 = \sqrt{G_{1x}^2 + G_{2x}^2}, \quad \alpha_y^2 = \sqrt{G_{1y}^2 + G_{2y}^2}$$

$$\omega_{xo} = \mathrm{atan}(G_{2x}/G_{1x}), \quad \omega_{yo} = \mathrm{atan}(G_{2y}/G_{1y}) \quad \text{and}$$

$$\lambda^2 = G_0 + 2G_{1x} + 2G_{1y} - 2\alpha_x^2 - 2\alpha_y^2.$$

The filter is tuned to two dimensional frequencies ($\omega_{xo}$, $\omega_{yo}$) corresponding to a spatial frequency magnitude of $\Omega = \sqrt{\omega_{xo}^2 + \omega_{yo}^2}$ and orientation $\theta = \mathrm{atan}(\omega_{xo}/\omega_{yo})$. The values $\lambda/\alpha_x$ and $\lambda/\alpha_y$ are approximately equal to the half 6 dB bandwidth of the filter in the x and y directions. Because the x and y bandwidth must be the same for the shape of the filter impulse response to be independent of orientation, it can be assumed that $\alpha = \alpha_x = \alpha_y$.

As with the one dimensional embodiment described above the output can be taken as the nodal voltages of the array, however it is advantageous to take the output as the current outputs of the transconductance amplifiers. If $i_r(m,n)$ is the sum of the output currents of the transconductance amplifiers driving node $v_r(m,n)$, then the complex valued current $i(m,n) = i_r(m,n) + ji_i(m,n)$ satisfies $$i(m,n) = jG_{2x}(v(m-1,n) - v(m+1,n)) + jG_{2y}(v(m,n-1) - v(m,n+1))$$

The transfer function from input to output current can be approximated by the continuous space transfer function $$\frac{I(\omega_x, \omega_y)}{U(\omega_x, \omega_y)} = \frac{j2\alpha^2(\omega_{xo}\omega_x + \omega_{yo}\omega_y)}{\lambda^2 + \alpha^2((\omega_x - \omega_{xo})^2 + (\omega_y - \omega_{yo})^2)}$$

Thus the filtering operation performed by the transconductance amplifiers approximates the directional derivative in the direction of the tune orientation $\theta$ and this enhances the orientation of the array.

A major advantage of the array of the present invention is that it is readily steerable and scalable, that is to say that it can be tuned to a particular orientation and to a particular scale. Furthermore this tuning can be done by appropriate selection of the resistances and the gains of the transconductance amplifiers as will now be explained.

The relative half bandwidth of the filter may be defined as $$\Delta = \frac{\lambda}{\alpha\Omega}$$

If this half bandwidth is kept constant, then the inverse of the tuned spatial frequency magnitude $\alpha = \Omega^{-1}$ becomes a scale parameter. Given desired values of $\Omega$, $\theta$ and $\Delta$ it is possible to choose resistance and transconductance gains that result in the corresponding filter.

If $G_{2(max)}$ is the maximum value of $G_2$ dictated by the circuit design, for given $\Omega$, $\theta$ and $\Delta$ 1. $\alpha^2 = G_{2(max)}\sqrt{1 + \cot^2\Omega}$
2. $G_{1x} = \alpha^2\cos(\Omega\cos\theta)$  $G_{2x} = \alpha^2\sin(\Omega\cos\theta)$  $G_{1y} = \alpha^2\cos(\Omega\sin\theta)$  $G_{2y} = \alpha^2\sin(\Omega\sin\theta)$
3. $G_0 = \alpha^2[(\Delta\Omega)^2 + 4 - 2\cos(\Omega\cos\theta) - 2\cos(\Omega\sin\theta)]$ Thus it can be seen that the interconnections between the cells and the values of the resistances and transconductance gains of the array determine the spatial frequency magnitude (ie the scale) the orientation of the filter. As long as the desired spatial frequency is less than $\pi/2$ all orientations can be achieved using positive resistances. spatial frequencies greater than $\pi/2$ correspond to spatial periods smaller than 4 pixels and are thus more likely to be higher then are required in practice. In order to achieve all orientations both positive and negative gains of the transconductance amplifiers are necessary. However, a negative transconductance gain is easier to obtain than a negative resistance. The relative bandwidth $\Delta$ is determined by the resistance $G_0$ from each node to ground. For all spatial frequency magnitudes and for all orientations, any relative bandwidth $\Delta$ can be achieved using a positive value for $G_0$.

It is possible to vary the spatial frequency magnitude from $\Omega_{min}$ to $\Omega_{max} < \pi/2$, the orientation from $-\pi$ to $\pi$ and the relative bandwidth from $\Delta_{min}$ to $\Delta_{max}$ by varying the resistances and transconductance gains between the following ranges:

$$-G_{2(max)} \leq G_{2x}, G_{2y} \leq G_{2(max)}$$
$$G_{2(max)}\cot\Omega_{max} \leq G_{1x}, G_{1y} \leq \alpha^2 \max$$
$$G_{0(min)} \leq G_0 \leq G_{0(max)}$$

Where $$\alpha_{min}^2 = G_{2(max)}\sqrt{1 + \cot^2\Omega_{max}}$$

$$\alpha_{max}^2 = G_{2(max)}\sqrt{1 + \cot^2\Omega_{min}}$$

$$0_{(min)} = \alpha_{max}^2((\Delta_{min}\Omega_{min})^2 + 2 - 2\cos\Omega_{min})$$

$$G_{0(max)} = \alpha_{min}^2\{(\Delta_{max}\Omega_{max})^2 + 4 - 4\cos(2^{\sqrt{}}\Omega_{max})\}$$

The maximum gain of the transconductance amplifiers can be chosen arbitrarily. One of the advantages of the present invention can be shown by considering the limits on $G_0$. The lower limit can be considered first. For fixed $\Omega$, $G_0$ is minimised for orientations $\theta=k(\pi/2)$ and $\Delta=\Delta_{min}$:

$$G_0=\alpha^2\{(\Delta_{min}\Omega)^2+2-2\cos\Omega\}$$

As $\Omega$ decreases $G_0$ decreases due to the decrease in the terms in the brackets, but this decrease is partially offset by an increase in $\alpha^2$ which in turn is due to the fact that the spatial frequency is being decreased by increasing the resistances of the resistive array rather than by decreasing the transconductance gains.

To consider the upper limit, for fixed $\Omega$, $G_0$ is maximised for orientations $\theta=(2k+1)(\pi/4)$ and $\Delta=\Delta_{max}$:

$$G_0=\alpha^2\{(\Delta_{max}\Omega)^2+4-4\cos(_2{}^{\sqrt{2}}\Omega)\}$$

As $\Omega$ increases $G_0$ increases due to the terms in the brackets, but this increase is partially offset by a decrease in $\alpha^2$. Thus the range over which $G_0$ must be adjusted is decreased.

The required orientations of the filter determine the constraints on the transconductance amplifiers. In some applications it may not be necessary to steer the filter over the entire range $-\pi$ to $\pi$ since the orientations $\theta$ and $\theta+\pi$ are essentially equivalent. Allowing the filter to be steered over only 0 to $\pi$ relaxes the constraint on $G_{2y}$ to $0\leq G_{2y}\leq G_{2(max)}$. Other applications may require only a few orientations, such as horizontal and vertical orientations and this can further relax the requirements on the transconductance amplifiers.

A practical implementation of the present invention has been made as a 25×25 pixel array using the 1.2 $\mu$m AMI CMOS n-well process available through MOSIS. Each pixel and its associated processing circuitry occupies an area of 146×129 $\mu$m. The total size, including pads, is 4.4×4.4 mm. The chip requires a supply of ±2.5V. The circuits are implemented using transistors operating above threshold.

Input to the chip is supplied via on-chip phototransistors. The photocurrents are mirrored into a common node which computes the average of the currents in the entire array. The average current is then subtracted from each pixel's current to give the input to the array.

The tuned orientation is limited to horizontal and vertical which relaxes the design requirements on the transconductance amplifiers as explained above. The transconductance amplifiers are implemented using 5 transistor NMOS differential pairs loaded by PMOS current mirrors. The measured value of $G_{2(max)}$ is 8 $\mu$A/V. The gains are selected by switching the bias currents on or off. Resistances $G_0$, $G_{1x}$ and $G_{1y}$ are implemented using CMOS transmission gates. The resistances are tunable by adjusting the gate voltages of the NMOS and PMOS transistors. The conductances can be varied over the following ranges with a linear range of ±300 mV:

2.5 $\mu$A/V $\leq G_0 \leq$ 9 $\mu$A/V

7 $\mu$A/V $\leq G_{1x}$, $G_{1y}\leq$ 28 $\mu$A/V

This corresponds to a spatial frequency range between 0.29 and 0.85 radians, ie spatial periods from 7.4 to 22 pixels. The relative half bandwidth can vary from 0.26 to 0.47.

Output from the array is obtained by mirroring the photocurrents and the outputs of the transconductance amplifiers. The currents, corresponding to the photosensor, even filter and odd filter outputs are switched via switches controlled by D flip flops onto three read-out lines which are held at virtual ground. On-chip transimpedance amplifiers convert the currents to voltages for output.

Figure 3A:
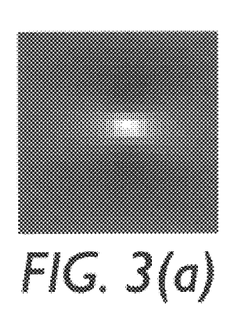
Figure 3B:
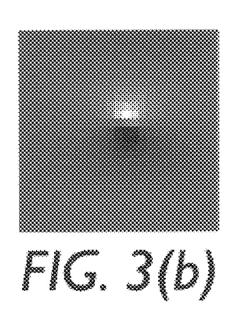
Figure 4A:
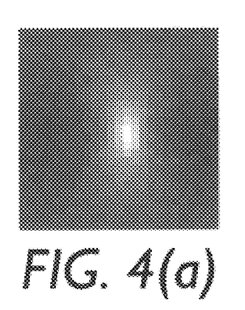
Figure 4B:
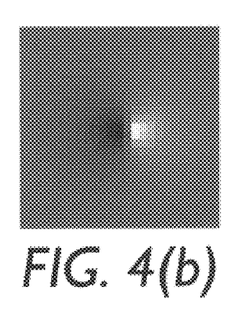
Figure 5A:
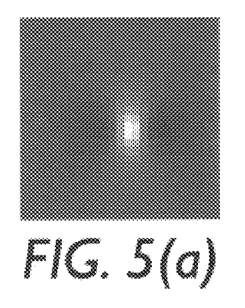
Figure 5B:
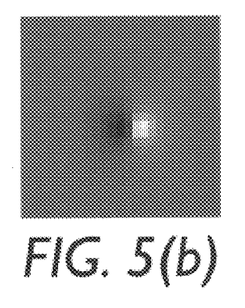
Figure 6A:
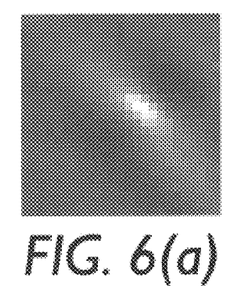
Figure 6B:
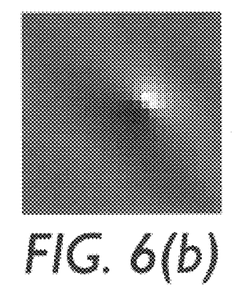

To test the spatial filtering of this embodiment of the invention, a light spot was focussed onto the center of the chip using a 4 mm lends and the outputs scanned off. The fixed pattern noise, measured with no light incident on the chip, was subtracted from the output in a digital postprocessing step. In FIGS. 3 to 6 the intensity levels have been normalised so that neutral Grey corresponds to zero and black and white correspond to the same absolute value. FIGS. 3 and 4 show the response of the chip when tuned to horizontal and vertical orientations. The difference in responses of the chip when tuned to the same orientation but different scales can be observed by comparing FIGS. 4 and 5. The difference is clearer when examining the even filter outputs, the odd filter outputs appear similar because the directional derivative performed by the transconductance amplifiers and the rapid decay of the modulating function at the origin cause the odd impulse response to obtain its peak positive and negative values near to the origin.

Although the sensor of this embodiment was not designed to enhance orientations other than vertical and horizontal, by setting $G_{2x}=G_{2y}$, 45° orientation selectivity can be obtained.

Figure 7A:
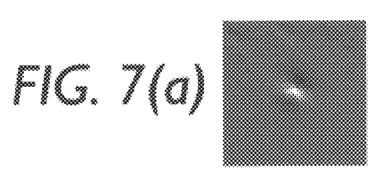
FIGS. 7(a)–(l) show results similar to FIGS. 3 to 6 for a 45×45 array, FIG. 8 schematically illustrates an hexagonal array, FIGS. 9(a) and (b) show how transistor elements may be used as resistive elements.
Figure 7B:
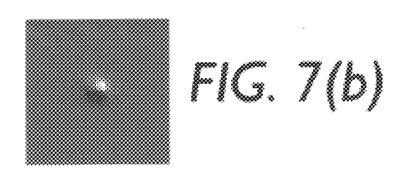
Figure 7C:
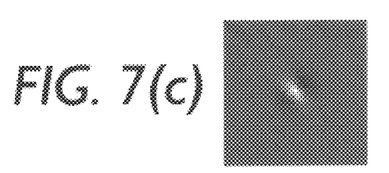
Figure 7D:
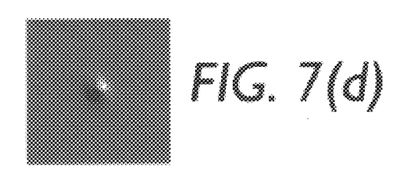
Figure 7E:
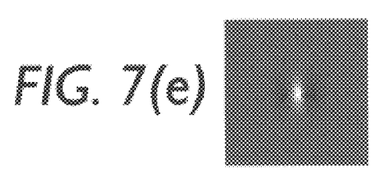
Figure 7F:
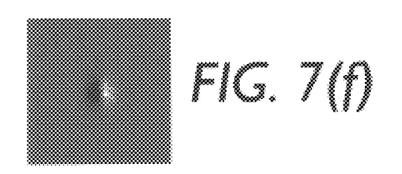
Figure 7G:
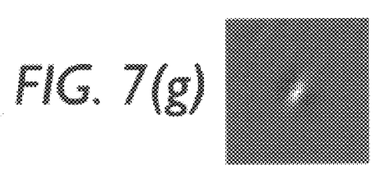
Figure 7H:
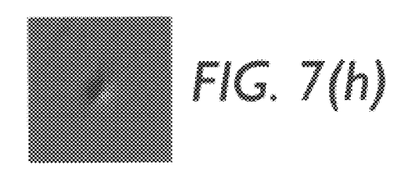
Figure 7I:
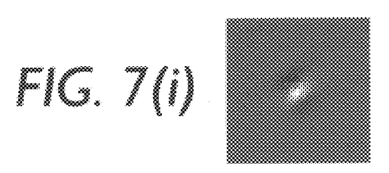
Figure 7J:
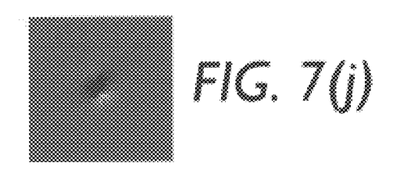
Figure 7K:
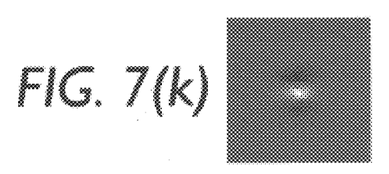
Figure 7L:
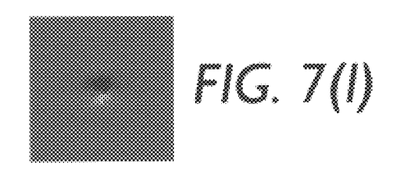

FIGS. 7(a)–(l) show the results from a 45×45 pixel array tuned to orientation $\theta=\pi/3$ (FIGS. 7(a) & (b)), $\pi/6$ (FIGS. 7(c) & (d)), 0 (FIGS. 7(e) & (f)), $-\pi/6$ (FIGS. 7(g) & (h)), $-\pi/3$ (FIGS. 7(i) & (j)) and $-\pi/2$ (FIGS. 7(k) & (l)). The chip can be tuned to orientations between $-\pi$ and $\pi$, but results are only shown here for a set of orientations between $-\pi/2$ and $\pi/2$ since the responses for orientations between $\theta+\pi$ is the same as that for $\theta$ except for a change of sign in the odd part.

Figure 8:
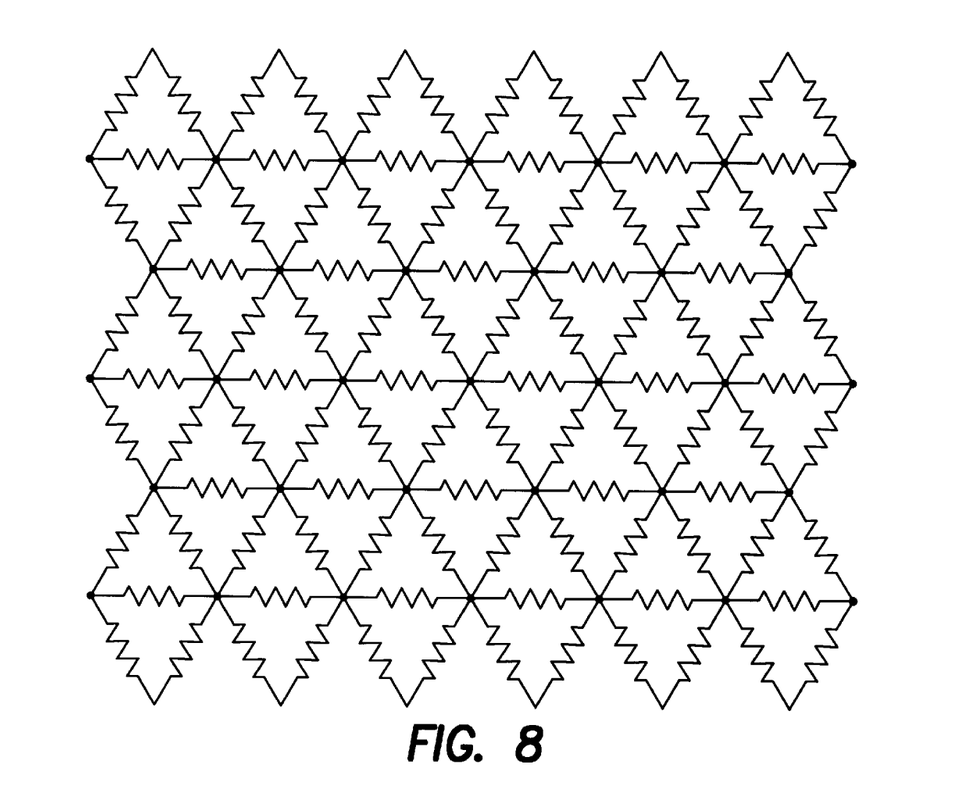

The present invention can be applied to a one dimensional array which may have applications in the field of image tracking and alignment and of course also to a two-dimensional array. A two-dimensional array may be arranged in a rectangular grid as described above, but that is not the only possibility. For example another possible arrangement would be a hexagonal array in which each pixel was provided with six nearest neighbours (as opposed to four in a rectangular array). FIG. 8 schematically illustrates such as array and in this possibility the resistive networks would extend in three directions rather than two as in a rectangular array.

In the embodiments described above the current sources are voltage controlled current sources in the form of transconductance amplifiers. However, another possibility is to use current controlled current sources. In the voltage controlled embodiments described above transistor circuits are used operating above threshold. While this results in a very fast circuit, it also requires a relatively large power consumption. Where applications do not require extremely fast frame rates, it is possible to read off speed for reduced power consumption.

Figure 9A:
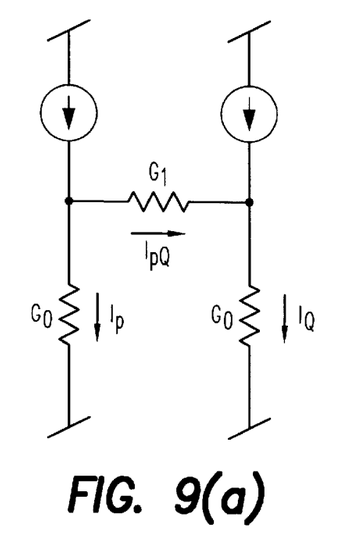
Figure 9B:
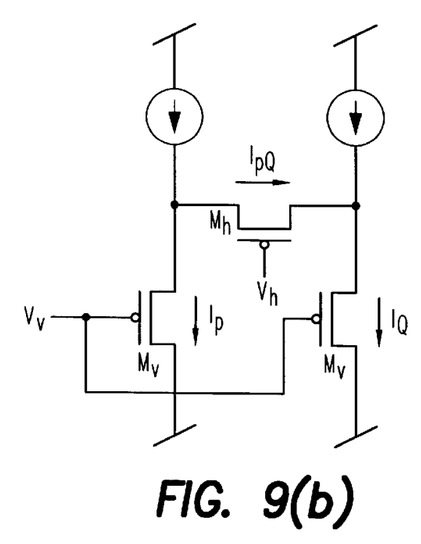

One way of achieving this is to use sub-threshold operating transistors, eg MOS transistors as the resistive elements in the first and second resistive networks and then to use current controlled current sources in place of the transconductance amplifiers connecting the networks. FIGS. 9(a) and (b) illustrate how the resistive elements in the network may be replaced by the transistor network. FIG. 9(a) shows a part of a resistive network and FIG. 9(b) shows how the same network part may be implemented using MOS transistors and keeping the same relationships between the currents.

Figure 10:
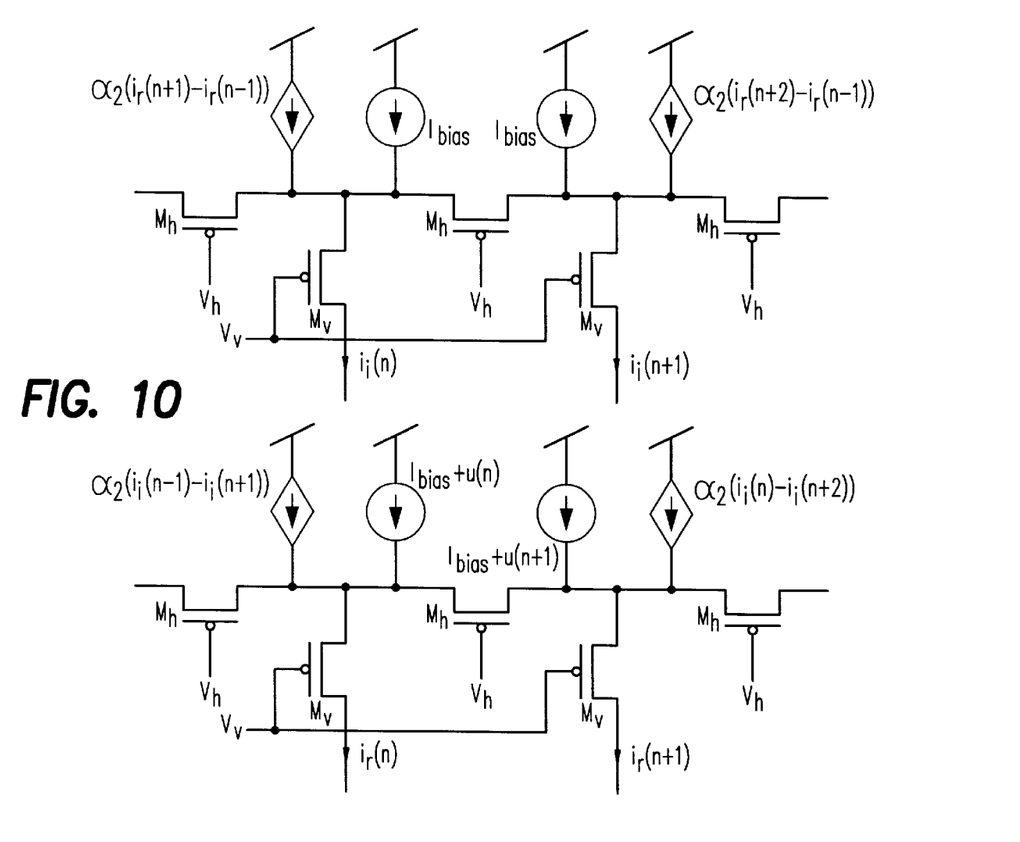
FIG. 10 shows a one-dimensional array using transistor elements.
Figure 11:
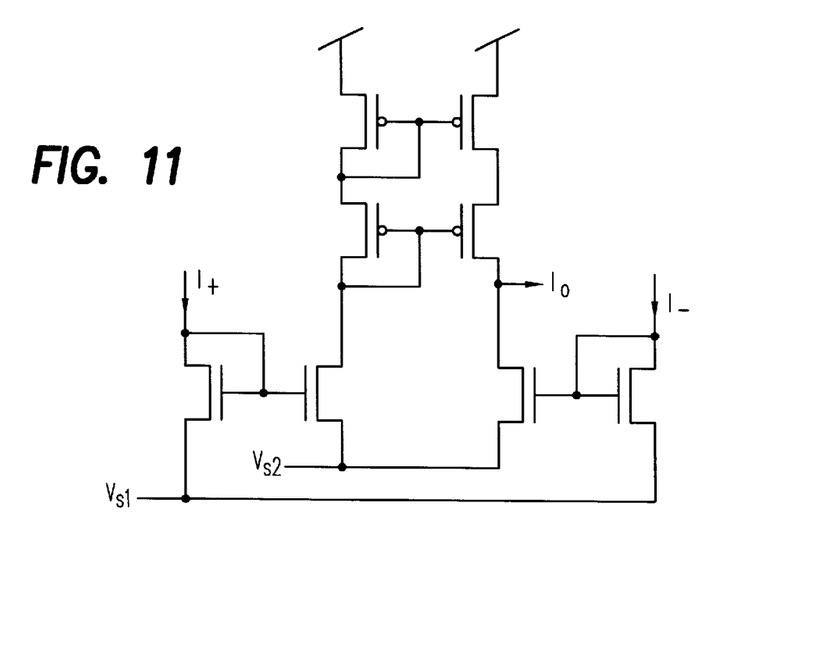
FIG. 11 shows one possible current controlled current source.

By replacing the resistive elements with transistor elements (which act as pseudo-conductance elements) a one-dimensional array is shown in FIG. 10 which illustrates the circuits associated with two pixels and their neighbours in a current mode implementation of the present invention. In this embodiment the voltage controlled current sources (ie the transconductance amplifiers) connecting the networks are replaced by current controlled current sources in the form of current amplifiers as shown in FIG. 11. The input currents to the current amplifiers are supplied directly from the drains of the corresponding transistors $M_v$ and the gain of the amplifier is controlled by the difference between the voltages $V_{s1}$ and $V_{s2}$. Raising $V_{s2}$ decreases the gain.

It will thus be seen that the present invention can provide a circuit architecture, especially a two dimensional circuit architecture, for orientation selective Gabor-type filtering consisting of two resistive networks coupled by voltage controlled current sources such as transconductance amplifiers (when operated in a voltage mode), or interconnected by current controlled current sources (when operated in a current mode). The orientation and scale of the filter can be adjusted by appropriate selection of the resistance and transconductance values. By means of time multiplexing one chip can compute the outputs of filters tuned to different scales and orientations.

The architecture of the present invention overcomes a number of disadvantages of the prior art. In particular the architecture can achieve all bandwidths for all spatial frequencies between 0 and $\pi/2$. By eliminating resistance connecting the resistive arrays, there is no need to match the resistances to the gains of the transconductance amplifiers. Furthermore since both negative and positive gains of the voltage/current controlled sources can be implemented all orientations can be achieved.

What is claimed is:

1. An analog circuit for spatially filtering a plurality of signals simultaneously at inputs to an array comprising:
   (a) a first resistive network having a plurality of nodes, each said node being associated with an input to the array,
   (b) a second resistive network having a plurality of nodes, each said node being associated with an input to the array,
   (c) means for injecting a current into each node of the first resistive network such that the magnitude of said current is dependent upon the voltages and/or currents in the second resistive network associated with nodes corresponding to the nearest neighbours of the corresponding input in the array,
   (d) means for injecting a current into each node of the second resistive network such that the magnitude of said current is dependent upon the voltages and/or currents in the first resistive network associated with nodes corresponding to the nearest neighbours of the corresponding input in the array, and
   (e) means for providing input to the circuit by injecting a current into each node of the said array such that the magnitude of said current is dependent upon the signal at the input of the array associated with said node.

2. A circuit as claimed in claim 1 wherein said nodes are disposed in a two-dimensional array.

3. A circuit as claimed in claim 2 wherein said array is a regular grid.

4. A circuit as claimed in claim 3 wherein said grid is rectangular, hexagonal or tridiagonal.

5. A circuit as claimed in claim 1 wherein said nodes are disposed in a one-dimensional array.

6. A circuit as claimed in claim 1 wherein said means for injecting current dependent on the signal at each input to the array is a photosensitive element adapted to convert the intensity of light into an electrical current.

7. A circuit as claimed in claim 1 wherein each of said resistive networks comprises transistor circuits such that the resistive connection between any first node and any second node of said circuit comprises a transistor circuit such that the current flowing between the first and second node increases monotonically with the voltage difference between the two nodes and the dependence between current and voltage is adjustable via one or more bias voltages.

8. A circuit as claimed in claim 1 wherein said means for injecting current into each node of the first resistive network is a set of voltage controlled current sources controlled by the voltages at nodes in the second resistive network corresponding to nearest neighbours of said node in the array, and wherein said means for injecting current into each node of the second resistive network is a set of voltage controlled current sources controlled by the voltages at nodes in the first resistive network corresponding to the nearest neighbours of said node in the array, and wherein the dependence of the output currents on the control voltages is adjustable via one or more bias voltages.

9. A circuit as claimed in claim 8 wherein said voltage controlled current sources comprise transconductance amplifiers.

10. A circuit as claimed in claim 8 wherein the nodes are disposed in a rectangular two-dimensional array and the current injected into each node of the first resistive network is supplied by two voltage controlled current sources, wherein the first voltage controlled current source is controlled by the difference between the voltages at the nodes of the second resistive network corresponding to the right and left nearest neighbours of the said node and wherein the second voltage controlled current source is controlled by the difference between the voltages at the nodes of the second resistive network corresponding to the top and bottom nearest neighbours of said node, and wherein the current injected into each node of the second resistive network is supplied by two voltage controlled current sources, the first voltage controlled current source being controlled by the difference between the voltages at the nodes of the first resistive network corresponding to the left and right nearest neighbours of the said node and the second voltage controlled current source being controlled by the difference between the voltages at the nodes of the first resistive network corresponding to the bottom and the top nearest neighbours of said node.

11. A circuit as claimed in claim 1 wherein said means for injecting current into each node of the first resistive network is a set of current controlled current sources whose inputs are the currents through resistive elements in the second resistive network connected to nodes corresponding to the nearest neighbours of said node in the array and wherein said means for injecting current into each node of the second resistive network is a set of current controlled current sources whose inputs are the currents through resistive elements connected to nodes in the first resistive network corresponding to the nearest neighbours of said node in the array, and wherein the dependence of the output currents on the control currents is adjustable via one or more bias voltages.

12. A circuit as claimed in claim 1 wherein the resistive connections and the dependence of the injected currents on the voltages and/or currents are adjustable to tune the orientation and scale of the filter.

13. An integrated circuit device for spatially filtering a plurality of signals simultaneously at inputs to an array comprising:
   (a) a first resistive network having a plurality of nodes, each said node being associated with an input to the array, (b) a second resistive network having a plurality of nodes, each said node being associated with an input to the array, (c) means for injecting a current into each node of the first resistive network such that the magnitude of said current is dependent upon the voltages and/or currents in the second resistive network associated with nodes corresponding to the nearest neighbours of the corresponding input in the array, (d) means for injecting a current into each node of the second resistive network such that the magnitude of said current is dependent upon the voltages and/or currents in the first resistive network associated with nodes corresponding to the nearest neighbours of the corresponding input in the array, and (e) means for providing input to the circuit by injecting a current into each node of the said array such that the magnitude of said current is dependent upon the signal at the input of the array associated with said node.

14. A device as claimed in claim 13 wherein said nodes are disposed in a two-dimensional array.

15. A device as claimed in claim 14 wherein said array is a regular grid.

16. A device as claimed in claim 15 wherein said grid is rectangular, hexagonal or tridiagonal.

17. A device as claimed in claim 13 wherein said nodes are disposed in a one-dimensional array.

18. A device as claimed in claim 13 wherein said means for injecting current dependent on the signal at each input to the array is a photosensitive element adapted to convert the intensity of light into an electrical current.

19. A device as claimed in claim 13 wherein each of said resistive networks comprises transistor circuits such that the resistive connection between any first node and any second node of said circuit comprises a transistor circuit such that the current flowing between the first and second node increases monotonically with the voltage difference between the two nodes and the dependence between current and voltage is adjustable via one or more bias voltages.

20. A device as claimed in claim 13 wherein said means for injecting current into each node of the first resistive network is a set of voltage controlled current sources controlled by the voltages at nodes in the second resistive network corresponding to nearest neighbours of said node in the array, and wherein said means for injecting current into each node of the second resistive network is a set of voltage controlled current sources controlled by the voltages at nodes in the first resistive network corresponding to the nearest neighbours of said node in the array, and wherein the dependence of the output currents on the control voltages is adjustable via one or more bias voltages.

21. A device as claimed in claim 20 wherein said voltage controlled current sources comprise transconductance amplifiers.

22. A device as claimed in claim 20 wherein the nodes are disposed in a rectangular two-dimensional array and the current injected into each node of the first resistive network is supplied by two voltage controlled current sources, wherein the first voltage controlled current source is controlled by the difference between the voltages at the nodes of the second resistive network corresponding to the right and left nearest neighbours of the said node and wherein the second voltage controlled current source is controlled by the difference between the voltages at the nodes of the second resistive network corresponding to the top and bottom nearest neighbours of said node, and wherein the current injected into each node of the second resistive network is supplied by two voltage controlled current sources, the first voltage controlled current source being controlled by the difference between the voltages at the nodes of the first resistive network corresponding to the left and right nearest neighbours of the said node and the second voltage controlled current source being controlled by the difference between the voltages at the nodes of the first resistive network corresponding to the bottom and the top nearest neighbours of said node.

23. A device as claimed in claim 13 wherein said means for injecting current into each node of the first resistive network is a set of current controlled current sources whose inputs are the currents through resistive elements in the second resistive network connected to nodes corresponding to the nearest neighbours of said node in the array and wherein said means for injecting current into each node of the second resistive network is a set of current controlled current sources whose inputs are the currents through resistive elements connected to nodes in the first resistive network corresponding to the nearest neighbours of said node in the array, and wherein the dependence of the output currents on the control currents is adjustable via one or more bias voltages.

24. A device as claimed in claim 13 wherein the resistive connections and the dependence of the injected currents on the voltages and/or currents are adjustable to tune the orientation and scale of the filter.

25. A method for filtering a two dimensional discrete signal with two filters simultaneously where the convolution kernel of the first said filter is even symmetric and orientation selective and wherein the convolution kernel of the second said filter is odd symmetric and orientation selective, comprising:

(a) providing first and second resistive networks, each said network having a plurality of nodes, each node being associated with one element of said two dimensional signal, (b) providing means for injecting current into each node of the first resistive network such that the magnitude of the current is dependent on the voltages and/or currents in the second resistive network associated with the nodes corresponding to the nearest neighbours of the corresponding element of the two-dimensional signal, (c) providing means for injecting current into each node of the second resistive network such that the magnitude of the current is dependent on the voltages and/or currents in the first resistive network associated with the nodes corresponding to the nearest neighbours of the corresponding element of the two-dimensional signal, (d) providing means for communicating the two-dimensional signal to the circuit by injecting a current into each node of the said array such that the magnitude of the said current is dependent upon the element of the two-dimensional signal associated with said node, and (e) providing means for outputting an electronic signal which depends upon a current or voltage associated with each node of the first and the second resistive networks.

26. A method as claimed in claim 25 comprising arbitrarily choosing the orientation selectivity and scale of the filter by selecting the properties of the resistive networks and the dependence of the currents injected into the first array on the voltages and/or currents in the second array and the dependence of the currents injected into the second array on the voltages and/or currents in the first array.

* * * * *